United States Patent
Du et al.

(10) Patent No.: US 11,393,665 B2
(45) Date of Patent: Jul. 19, 2022

(54) PHYSICAL VAPOR DEPOSITION (PVD) CHAMBER WITH REDUCED ARCING

(71) Applicant: APPLIED MATERIALS, INC., Santa Clara, CA (US)

(72) Inventors: Chao Du, Sunnyvale, CA (US); Yong Cao, San Jose, CA (US); Chen Gong, Sunnyvale, CA (US); Mingdong Li, Santa Clara, CA (US); Fuhong Zhang, San Jose, CA (US); Rongjun Wang, Dublin, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 130 days.

(21) Appl. No.: 16/285,043

(22) Filed: Feb. 25, 2019

(65) Prior Publication Data

US 2020/0051795 A1 Feb. 13, 2020

Related U.S. Application Data

(60) Provisional application No. 62/717,648, filed on Aug. 10, 2018.

(51) Int. Cl.
 *C23C 14/34* (2006.01)
 *H01J 37/34* (2006.01)
 *H01J 37/32* (2006.01)

(52) U.S. Cl.
 CPC ......... *H01J 37/3411* (2013.01); *C23C 14/34* (2013.01); *H01J 37/3244* (2013.01); *H01J 37/32834* (2013.01); *H01J 2237/332* (2013.01)

(58) Field of Classification Search
 CPC .... C23C 14/34; C23C 14/564; H01J 37/3244; H01J 34/32834; H01J 37/3411; H01J 2237/332

(Continued)

(56) References Cited

U.S. PATENT DOCUMENTS 4,094,764 A * 6/1978 Boucher ............... C23C 14/228
                                                      204/192.12
5,487,822 A * 1/1996 Demaray ............ C23C 14/3407
                                                      204/298.09

(Continued)

FOREIGN PATENT DOCUMENTS

JP    05-247639    *  9/1993
JP    09-111446    *  4/1999

(Continued)

OTHER PUBLICATIONS

Machine Translation 09-111446 (Year: 1997).*

(Continued)

*Primary Examiner* — Rodney G McDonald
(74) *Attorney, Agent, or Firm* — Moser Taboada

(57) ABSTRACT

Embodiments of a process chamber are provided herein. In some embodiments, a process chamber includes a chamber body having an interior volume, a substrate support disposed in the interior volume, a target disposed within the interior volume and opposing the substrate support, a process shield disposed in the interior volume and having an upper portion surrounding the target and a lower portion surrounding the substrate support, the upper portion having an inner diameter that is greater than an outer diameter of the target to define a gap between the process shield and the target, and a gas inlet to provide a gas to the interior volume through the gap or across a front opening of the gap to substantially prevent particles from the interior volume from entering the gap during use.

20 Claims, 2 Drawing Sheets

(58) Field of Classification Search
USPC .................................... 204/298.11, 298.07
See application file for complete search history.

(56) References Cited

U.S. PATENT DOCUMENTS

| | | |
|---|---|---|
| 9,865,440 B1 | 1/2018 | Kassela et al. |
| 9,957,601 B2 | 5/2018 | Rasheed et al. |
| 2006/0073283 A1* | 4/2006 | Brown .................. C23C 14/046 427/457 |

FOREIGN PATENT DOCUMENTS

| | | | |
|---|---|---|---|
| JP | 11-302838 | * | 11/1999 |
| JP | 2007-277649 | * | 10/2007 |

OTHER PUBLICATIONS

Machine Translation 05-247639 (Year: 1993).*
Machine Translation 2007-277649 (Year: 2007).*
Machine Translation Jp 11-302838 (Year: 1999).*

* cited by examiner

PHYSICAL VAPOR DEPOSITION (PVD) CHAMBER WITH REDUCED ARCING

CROSS-REFERENCE TO RELATED APPLICATIONS

This application claims benefit of U.S. provisional patent application Ser. No. 62/717,648, filed Aug. 10, 2018, which is herein incorporated by reference in its entirety.

FIELD

Embodiments of the present disclosure generally relate to semiconductor processing techniques, and more particularly, to techniques for physical vapor deposition of materials on a substrate.

BACKGROUND

Sputtering, also known as physical vapor deposition (PVD), is a method of forming features in integrated circuits. Sputtering deposits a layer of material onto a substrate. A source material, such as a target, is bombarded by ions to eject material form the target. The material then deposits on the substrate. The inventors have observed that during the deposition process, material or contaminants can outgas from the substrate. The outgassing from the substrate can reach the target and can lead to arcing.

Therefore, the inventors have provided improved PVD processing chambers and methods of use thereof.

SUMMARY

Embodiments of a physical vapor deposition (PVD) process chamber are provided herein. In some embodiments, a process chamber includes a chamber body having an interior volume; a substrate support disposed in the interior volume; a target disposed within the interior volume and opposing the substrate support; a process shield disposed in the interior volume and having an upper portion surrounding the target and a lower portion surrounding the substrate support, the upper portion having an inner diameter that is greater than an outer diameter of the target to define a gap between the process shield and the target; and a gas inlet to provide a gas to the interior volume through the gap or across a front opening of the gap to substantially prevent particles from the interior volume from entering the gap during use.

In some embodiments, a physical vapor deposition (PVD) process chamber includes a target disposed within an interior volume of the PVD process chamber and near a lid of the PVD process chamber; a substrate support disposed in the PVD process chamber and opposing the target; a process shield surrounding the target and spaced apart from the target to define a gap between the process shield and the target; one or more gas inlets disposed between the substrate support and the lid to provide a gas to the interior volume through the gap or across a front opening of the gap to substantially prevent particles from within the process chamber from entering the gap during use; and a pump in fluid communication with the process chamber to remove the gas from the process chamber during use.

In some embodiments, a method of processing a substrate includes performing a physical vapor deposition (PVD) process on a substrate within an interior volume of a process chamber, wherein a process shield is disposed in the interior volume about a target such that an outer sidewall of the target and an inner surface of the process shield define a gap; and injecting a gas within the process chamber through the gap or across a front opening of the gap via a first gas inlet to substantially prevent particles from the interior volume from entering the gap.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate only some embodiments of the disclosure and are therefore not to be considered limiting of scope, for the disclosure may admit to other equally effective embodiments.

Figure 1:
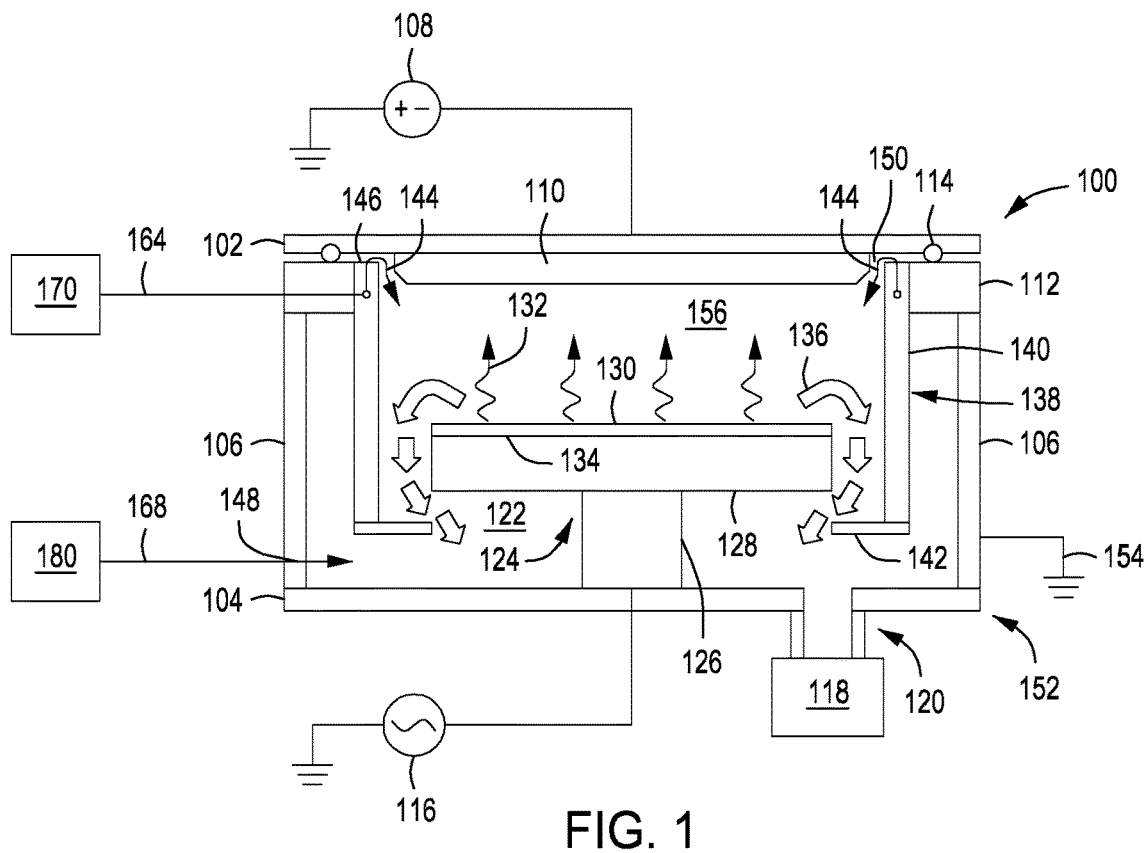
FIG. 1 depicts a schematic view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Figure 2:
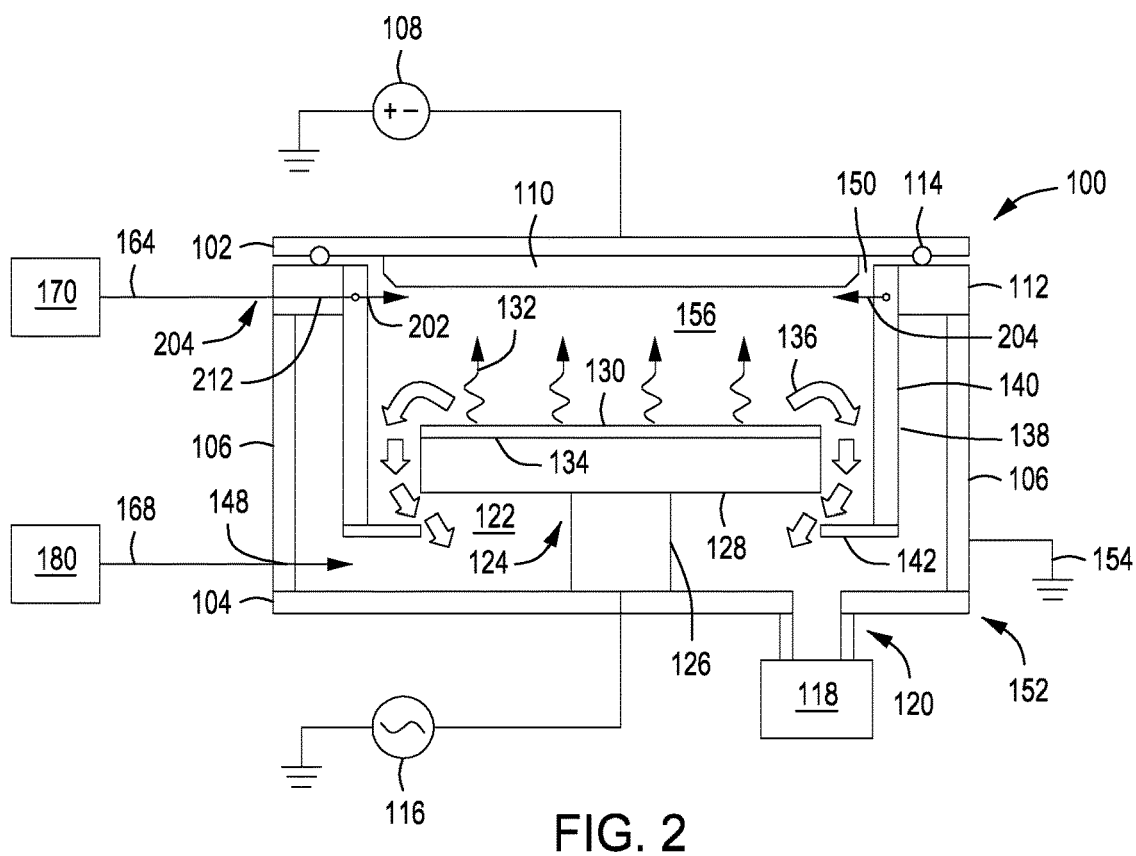
FIG. 2 depicts a schematic view of a process chamber in accordance with at least some embodiments of the present disclosure.

Embodiments of an improved process chamber and an improved method of processing a substrate are provided herein. The embodiments disclosed above can be performed in a suitably configured physical vapor deposition (PVD) process chamber. For example, FIGS. 1 and 2 depict schematic views of a process chamber that is suitable for performing the methods described herein in accordance with some embodiments of the present disclosure. The specific configuration of the process chamber is illustrative and process chambers having other configurations may also benefit modifications in accordance with the teachings provided herein. Examples of process chambers suitable for modification in accordance with the teachings disclosed herein include any of the ENDURA® line of PVD processing chambers, commercially available from Applied Materials, Inc., of Santa Clara, Calif. Other processing chambers from Applied Materials, Inc. or other manufactures may also benefit from the teachings disclosed herein.

As shown in FIG. 1, a process chamber 100 for performing a PVD process includes a chamber body 152. The chamber body 152 generally includes a top wall 102 (or lid), a bottom wall 104, and sidewalls 106 that connect the top wall 102 to the bottom wall 104. The top wall 102, the bottom wall 104, and the sidewalls 106 define an interior volume 122. In some embodiments, the chamber body 152 includes an adapter 112 that extends radially inward from the sidewalls 106. The adapter 112 may be part of the sidewalls 106 or may be a separate component. In some embodiments, the adapter 112 may be part of a process shield (described below). The top wall 102 may be coupled to the sidewalls 106 via the adapter 112. In some embodiments, a seal ring 114 may be disposed between the adapter 112 and the top wall 102 to prevent ingress or egress of fluid between the adapter 112 and the top wall 102 (e.g., during processing with vacuum pressures in the interior volume 122). The top wall 102 is generally removable from the sidewalls 106, for example, to facilitate maintenance or replacement of target 110, discussed below. The chamber body 152 may be grounded via a coupling to ground 154. The top wall 102 can be electrically floating or grounded.

An exhaust port 120 is disposed proximate the bottom wall 104 of the chamber body 152. As shown in FIG. 1, the exhaust port 120 is disposed in an opening of the bottom wall 104. In some embodiments, a pump 118 is coupled to the exhaust port 120. The pump 118 is configured to regulate a pressure within the chamber body 152, such as to maintain a vacuum. In some embodiments, the pump 118 is configured to evacuate gases introduced in the interior volume 122 during the deposition process. In some embodiments, the pump 118 is configured to evacuate gases formed during the deposition process.

A substrate support 124 is disposed in the interior volume 122. In some embodiments, the substrate support 124 includes a shaft 126 and a pedestal 128. The shaft 126 can include conduits to provide, for example, fluids, coolants, power, or the like to the pedestal 128. The pedestal 128 has an upper surface 134 that is configured to receive a substrate 130 (such as a 200 mm, 300 mm, or the like wafer or a substrate having some other form factor) for processing. The substrate support 124 is configured to support the substrate 130 such that a center of the substrate 130 is aligned with a central axis of the process chamber 100 (or of the processing volume 156, discussed below). The substrate support 124 is coupled to an RF bias power source 116. In some embodiments, the RF bias power source 116 is configured to induce an AC bias or a DC bias on the substrate 130.

A target 110 is disposed within the interior volume 122 of the chamber body 152. The target 110 is disposed opposing the substrate support 124. For example, the target 110 may be coupled to the top wall 102. The process chamber 100 includes an RF power source 108 and an associated magnetron coupled to the target 110. The RF power source 108 is configured to provide RF energy to the target 110. The target 110 comprises a source material to be deposited on the substrate 130 during sputtering. In some embodiments, the source material may be a metal, metal oxide, metal alloy, or the like. In some embodiments, the target 110 may include a backing plate comprising a conductive material, such that the RF power source 108 can be coupled to the target 110 via the backing plate.

A process shield 138 having an upper portion 140 and a lower portion 142 is disposed in the interior volume 122. In some embodiments, the process shield 138 has a cylindrical body. In some embodiments, the process shield 138 comprises a single piece metal body. In some embodiments, the process shield 138 comprises a single piece body that includes the adapter 112. The lower portion 142 surrounds the substrate support 124. In some embodiments, the upper portion 140 is disposed about and spaced apart from the target 110 to form a gap 150 between the upper portion 140 of the process shield 138 the target 110 (e.g., an annular gap for round target/shield configurations). The gap 150 extends from an inner surface of the upper portion 140 of the process shield 138 to an outer sidewall of the target 110. An outer edge of the target 110 and the inner surface of the upper portion 140 define a front opening of the gap 150. The process shield 138, the target 110, and the substrate support define a processing volume 156 within the interior volume 122.

A gas inlet is disposed near the target 110 to provide a process gas to the interior volume 122 in a location proximate the target 110, as described in more detail below. In some embodiments, as shown in FIG. 1, the gas inlet is a gas inlet 146 disposed through an upper surface of the process shield 138. A conduit 164 is disposed through the process shield 138 and terminates at the gas inlet 146. The conduit 164 is coupled to a first gas source 170 to provide a gas, for example, a process gas, to the processing volume 156 through the gas inlet 146. The gas inlet 146 is disposed in a position to provide a gas flow path 144 through the gap 150 to advantageously prevent or substantially prevent particles from within the process chamber to flow into the gap 150. In some embodiments, the gas inlet 146 may be disposed in a top surface of the process shield 138, as shown. In some embodiments, the gas inlet 146 may be disposed in a radially inward facing surface proximate the top surface of the process shield 138 such that gas provided to the interior volume 122 flows through the gap 150. In some embodiments, a gas flow path 144 passes from a space between the top wall 102 and the process shield 138, through the gap 150, and into the processing volume 156 via the gas inlet 146. The gas inlet 146 is configured to flow a process gas to the interior volume 122 such that the process gas directs gas within the interior volume away from the gap 150 between the process shield 138 and the target 110. In some embodiments, the process gas is reactive, for example, comprising nitrogen ($N_2$), oxygen ($O_2$), or the like. In some embodiments, the process gas is inert, such as argon (Ar), helium (He), krypton (Kr), xenon (Xe), or the like. In some embodiments, the process gas is a mixture of a reactive gas and an inert gas, for example, a combination of any of the reactive and inert gases disclosed above. A directed flow path 136 passes from the processing volume 156 downward toward the bottom wall 104 (e.g., toward the exhaust port 120) via a gap between the lower portion 142 of the process shield 138 and the substrate support 124. The gas inlet 146 may comprise one or more gas inlets. In some embodiments, the gas inlet 146 is configured to uniformly distribute gas to the processing volume 156 from a source exterior to the process chamber 100.

In some embodiments, as shown in FIG. 2, the gas inlet is a gas inlet 202 disposed in a sidewall of the process shield 138. A conduit 212 is disposed through the process shield 138 and terminates at the gas inlet 202 in the process shield 138. The conduit 212 is coupled to the first gas source 170 to provide a gas, for example, a process gas, to the processing volume 156 through the gas inlet 146. The gas inlet 146 is advantageously disposed in a position to provide a gas flow path 204 across the opening of the gap 150 to prevent or substantially prevent particles from within the process chamber to flow into the gap 150 (e.g., to form a gas curtain across the front of the gap 150). The process gas can be any of the process gases noted above with respect to FIG. 1. The gas inlet 202 may comprise one or more gas inlets. In some embodiments, the gas inlet 202 is configured to uniformly distribute gas to the processing volume 156 from a source exterior to the process chamber 100.

Either or both of the gas inlet 146 or the gas inlet 202 can be one gas inlet or a plurality of gas inlets arranged to provide a substantially uniform flow of gas through the gap 150 and into the processing volume 156 or across the front opening of the gap 150 to prevent or substantially prevent particles flowing into the gap 150. For example, the first gas source 170 may be coupled to one or more inlets disposed in the process shield 138 to provide gas to an inner channel or plenum disposed within the process shield 138. A plurality of gas inlets configured, for example, as gas inlet 146 or gas inlet 202, can be disposed in the process shield 138 to couple the inner channel or plenum to the processing volume 156 through the gas inlets. In some embodiments, the plurality of gas inlets can be equidistantly angularly spaced from each other.

In use, a source material, such as the target 110, is bombarded by ions from a plasma to eject material form the target 110. For example, a process gas may be provided to the processing volume and sufficient power provided to the target 110 to excite the process gas into the plasma. The ejected material then deposits on the substrate 130. During the deposition process, materials or contaminants may be released from the substrate toward the target 110, for example via outgassing, and generally represented by arrows 132. The materials or contaminants may condense on surfaces facing the processing volume 156, including in an area between the target 110 and the process shield 138. Condensation within the area between the target 110 and the process shield 138 may lead to arcing during processing.

The gas inlet 146, 202 disposed near the target 110 advantageously reduces or prevents the materials or contaminants (e.g., arrows 132) from reaching the target 110 or the region between the target and the process shield 138 to reduce or prevent arcing. The gas inlet 146, 202 disposed near the target 110 advantageously reduces or prevents the materials or contaminants from redepositing on the target 110 or upper portions of the process shield 138. The pump 118 is in fluid communication with the process chamber 100 via the exhaust port 120 to remove the gas from the process chamber 100 during use.

In some embodiments, a second gas inlet 148 is disposed between the process shield 138 and the bottom wall 104, including being disposed within the bottom wall 104. For example, the second gas inlet 148 may be disposed outside of and beneath the processing volume 156, or beneath the pedestal 128. A conduit 168 is disposed through the sidewall 106 and terminates at the second gas inlet 148. The conduit 168 is coupled to a second gas source 180 to provide a gas to the processing volume 156 through the gas inlet 148. The second gas inlet 148 may provide additional inert, reactive, or mixture of inert and reactive process gas to the interior volume 122. The additional process gas may be the same as the process gas provided by the gas inlet 146, 202. In some embodiments, the second gas inlet 148 is configured to direct gas within the interior volume 122 toward the exhaust port 120. For example, the second gas inlet 148 may direct gas from the directed flow path 136 toward the exhaust port 120. In some embodiments, the second gas inlet 148 is positioned on a side of the chamber body 152 opposite the pump 118.

In some embodiments, the process chamber 100 may include the gas inlet 146 and the gas inlet 202. In some embodiments, parameters of the process chamber 100 may be tuned to encourage downward gas flow within the chamber body 152. The parameters include flow rate of process gases, pressure, or the like.

Figure 3:
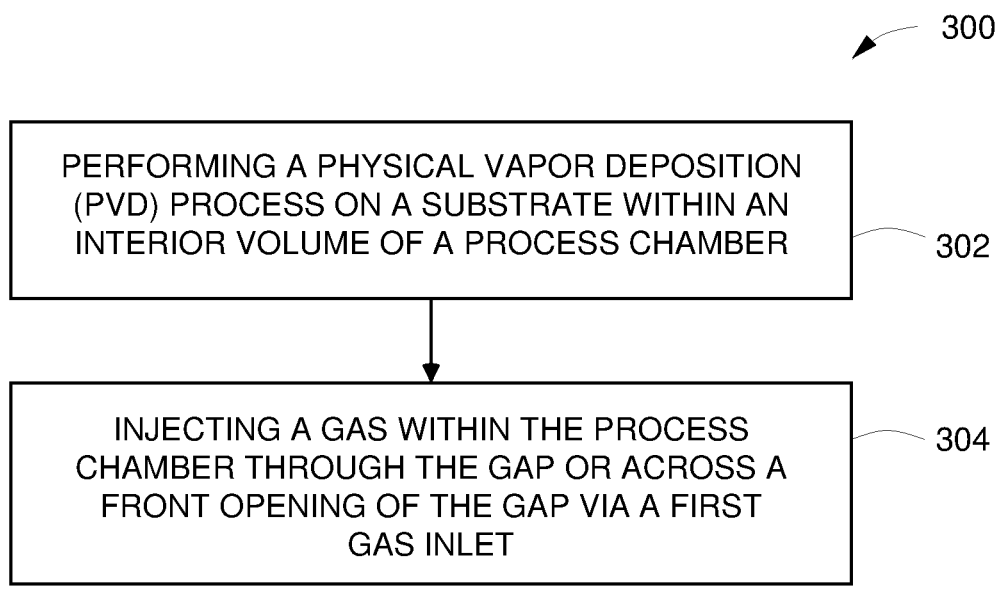
FIG. 3 depicts a flow chart of a method of processing a substrate in accordance with at least some embodiments of the present disclosure.

FIG. 3 depicts a flow chart of a method 300 of processing a substrate in accordance with at least some embodiments of the present disclosure. At 302, the method 300 of processing a substrate includes performing a physical vapor deposition (PVD) process on a substrate within an interior volume of a process chamber, wherein a process shield is disposed in the interior volume about a target such that an outer sidewall of the target and an inner surface of the process shield define a gap. In some embodiments, the process chamber 100 described above may be used to perform the method 300. In some embodiments, any suitable PVD process chamber may be used.

At 304, the method 300 includes injecting a gas within the process chamber through the gap or across a front opening of the gap via a first gas inlet to substantially prevent particles from the interior volume from entering the gap. The gas can be reactive or inert. In some embodiments, the method 300 includes using a pump to remove gas from the process chamber. In some embodiments, the method 300 includes additionally injecting the gas near a lower portion of the process chamber via a second gas inlet to direct gas flow within the process chamber toward the pump. The gas injected by the second gas inlet can be reactive or inert.

While the foregoing is directed to embodiments of the present disclosure, other and further embodiments of the disclosure may be devised without departing from the basic scope thereof.

The invention claimed is:

1. A process chamber, comprising:
a chamber body having an interior volume;
a substrate support disposed in the interior volume;
a target disposed within the interior volume and opposing the substrate support;
a process shield disposed in the interior volume and having an upper portion surrounding the target and a lower portion surrounding the substrate support, the upper portion having an inner diameter that is greater than an outer diameter of the target to define a gap between the process shield and the target, wherein the gap has an open first end and a closed second end opposite the first end, and wherein the gap has a line of sight to the substrate support; and
a gas inlet to provide a gas to the interior volume through the gap or across a front opening of the gap, wherein the gas inlet is disposed in a top surface of the process shield vertically above the front opening of the gap and proximate the closed second end of the gap or is disposed below the target and configured to direct the gas horizontally inward or inward and upward across the front opening of the gap proximate the target, and wherein the gas inlet is configured to substantially prevent particles from the interior volume from entering the gap during use.

2. The process chamber of claim 1, further comprising an exhaust port disposed proximate a bottom wall of the chamber body.

3. The process chamber of claim 1, wherein the gas inlet is disposed below the target and extends horizontally through a sidewall of the process shield to provide the gas across the front opening of the gap.

4. The process chamber of claim 3, further comprising a second gas inlet disposed between the process shield and a bottom wall.

5. The process chamber of claim 4, wherein the gas inlet is coupled to a first gas source and the second gas inlet is coupled to a second gas source that is fluidly independent from the first gas source.

6. The process chamber of claim 4, wherein the second gas inlet is configured to direct gas within the interior volume toward an exhaust port.

7. The process chamber of claim 1, wherein the gas inlet is disposed in the top surface of the process shield opposite a top wall of the chamber body and a gas flow path extends from the top surface to an inner surface of the process shield different than the top surface and into the interior volume.

8. The process chamber of claim 1, wherein the gas inlet is configured to flow the gas in a direction away from the substrate support to a direction radially inward and through a gap located between the process shield and the target.

9. The process chamber of claim 1, wherein the process shield comprises a single piece metal body.

10. A physical vapor deposition (PVD) process chamber, comprising:
a target disposed within an interior volume of the PVD process chamber and near a lid of the PVD process chamber;
a substrate support disposed in the PVD process chamber and opposing the target;
a process shield surrounding the target and spaced apart from the target to define a gap between the process shield and the target;
a plurality of gas inlets disposed between the substrate support and the lid to provide a gas to the interior volume through the gap from a location vertically above a front opening of the gap or across the front opening of the gap proximate the target, and wherein the gas inlets are configured to substantially prevent particles from within the process chamber from entering the gap during use, wherein the plurality of gas inlets are equidistantly angularly spaced from each other, and wherein a gas flow path in the interior volume extends through a gap between a lower portion of the process shield and the substrate support; and
a pump in fluid communication with the process chamber to remove the gas from the process chamber during use.

11. The PVD process chamber of claim 10, wherein the plurality of gas inlets are disposed on an uppermost surface of the process shield to provide the gas to the interior volume through the gap.

12. The PVD process chamber of claim 10, wherein the plurality of gas inlets are disposed between the process shield and the target.

13. The PVD process chamber of claim 10, wherein the plurality of gas inlets are disposed in the process shield.

14. The PVD process chamber of claim 10, wherein the process shield comprises a single piece metal body.

15. The PVD process chamber of claim 10, further comprising a second gas inlet disposed between the process shield and a bottom wall of the PVD process chamber.

16. The PVD process chamber of claim 15, wherein the second gas inlet is positioned on a side of the substrate support opposite the pump.

17. A method of processing a substrate, comprising:
performing a physical vapor deposition (PVD) process on a substrate within an interior volume of a process chamber, wherein a process shield is disposed in the interior volume about a target such that an outer sidewall of the target and an inner surface of the process shield define a gap having an open first end and a closed second end opposite the first end, and wherein the gap has a line of sight to a substrate support; and
injecting a gas within the process chamber through the gap via a first gas inlet disposed in a top surface of the process shield vertically above a front opening of the gap and proximate the closed second end or across the front opening of the gap via a first gas inlet disposed below the target and configured to direct the gas horizontally inward or inward and upward across the front opening of the gap proximate the target, and wherein the first gas inlet is configured to substantially prevent particles from the interior volume from entering the gap.

18. The method of claim 17, further comprising using a pump to remove the gas from the process chamber.

19. The method of claim 18, further comprising additionally injecting the gas near a lower portion of the process chamber via a second gas inlet to direct the gas within the process chamber toward the pump.

20. The method of claim 17, wherein the first gas inlet is configured to flow the gas through a gap disposed between the process shield and the target.

* * * * *